United States Patent
Chinn et al.

(10) Patent No.: US 7,074,723 B2
(45) Date of Patent: Jul. 11, 2006

(54) METHOD OF PLASMA ETCHING A DEEPLY RECESSED FEATURE IN A SUBSTRATE USING A PLASMA SOURCE GAS MODULATED ETCHANT SYSTEM

(75) Inventors: Jeffrey D. Chinn, Foster City, CA (US); Michael Rattner, Santa Clara, CA (US); Nicholas Pornsin-Sirirak, Sunnyvale, CA (US); Yanping Li, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 222 days.

(21) Appl. No.: 10/210,929

(22) Filed: Aug. 2, 2002

(65) Prior Publication Data

US 2004/0023508 A1 Feb. 5, 2004

(51) Int. Cl.
 *H01L 21/302* (2006.01)

(52) U.S. Cl. .................. 438/714; 438/719; 438/695; 438/700; 438/713; 438/725; 438/734

(58) Field of Classification Search .............. 438/714, 438/719, 695, 700, 713, 725, 734
See application file for complete search history.

(56) References Cited

U.S. PATENT DOCUMENTS

| | | | | |
|---|---|---|---|---|
| 4,533,430 A | 8/1985 | Bower | ...................... | 156/643 |
| 4,579,623 A | 4/1986 | Suzuki et al. | ................ | 156/626 |
| 4,795,529 A | 1/1989 | Kawasaki et al. | .......... | 156/643 |
| 4,855,017 A | 8/1989 | Douglas | ...................... | 156/643 |
| 5,501,893 A | 3/1996 | Laermer et al. | ............ | 428/161 |
| 6,051,503 A | 4/2000 | Bhardwaj et al. | ........... | 438/705 |
| 6,127,273 A | 10/2000 | Laermer et al. | ............ | 438/709 |
| 6,284,148 B1 | 9/2001 | Laermer et al. | ............... | 216/37 |
| 6,284,666 B1 * | 9/2001 | Naeem et al. | .............. | 438/713 |
| 6,318,384 B1 * | 11/2001 | Khan et al. | ................ | 134/22.1 |
| 6,355,181 B1 | 3/2002 | McQuarrie | ..................... | 216/2 |
| 6,380,095 B1 * | 4/2002 | Liu et al. | ..................... | 438/719 |

FOREIGN PATENT DOCUMENTS

| | | |
|---|---|---|
| JP | 63013334 | 1/1988 |
| WO | WO 00/67307 | 11/2000 |

* cited by examiner

*Primary Examiner*—George Goudreau
(74) *Attorney, Agent, or Firm*—Shirley L. Church

(57) ABSTRACT

We have developed an uncomplicated method of plasma etching deeply recessed features such as deep trenches, of at least 5 µm in depth, in a silicon-containing substrate, in a manner which generates smooth sidewalls, having a roughness of less than about 1 µm, typically less than about 500 nm, and even more typically between about 100 nm and 20 nm. Features having a sidewall taper angle, relative to an underlying substrate, typically ranges from about 85° to about 92° and exhibiting the smooth sidewalls are produced by the method. In one embodiment, a stabilizing etchant species is used constantly during the plasma etch process, while at least one other etchant species and at least one polymer depositing species are applied intermittently, typically periodically, relative to each other. In another embodiment, the stabilizing etchant species is used constantly and a mixture of the other etchant species and polymer depositing species is used intermittently.

51 Claims, 4 Drawing Sheets

METHOD OF PLASMA ETCHING A DEEPLY RECESSED FEATURE IN A SUBSTRATE USING A PLASMA SOURCE GAS MODULATED ETCHANT SYSTEM

BACKGROUND OF THE INVENTION

1. Field of the Invention

The present invention pertains to a method of plasma etching recessed structures such as a deep trench in a substrate. The plasma source gas used to generate plasma etchant species is modulated during the etching process. The method is particularly useful in combination with particular plasma source gases for etching trenches in a silicon substrate.

2. Brief Description of the Background Art

Deep recessed structure etching is one of the principal technologies currently being used to fabricate microstructure devices, and is an enabling technology for many microelectromechanical systems (MEMS) applications. Strict control of the etch profile is required for these new, complex devices to perform satisfactorily. In a number of instances, it is desired to etch a vertical side wall, where vertical typically means that a taper angle formed by the side wall with a horizontal line drawn at the base of the side wall ranges from 85° up to 92°. Obtaining a controlled sidewall taper angle of 85° to 92° in combination with a smooth sidewall surface has proved a difficult task in many instances. In addition, microloading has been observed during the etching of substrates where some recess features are densely positioned while other recess features are isolated.

Trenches with a sidewall positive taper angle of 85° up to 92° are useful in a variety of MEMS devices such as optical switches, tuneable capacitors, accelerometers, and gyroscopes, by way of example and not by way of limitation.

Plasma etching of deeply recessed structures, where the depth of the recess is at least 10 μm, typically require a combination of reactive chemical etching with physical etching, which typically employs ion bombardment. The physical etching enables anisotropic, directional etching necessary to produce vertical sidewalls on an etched trench, for example. However, to obtain a vertical sidewall, it is necessary to control the incoming ions so that they strike the bottom of the feature being etched, but not the already etched surfaces extending above the bottom of the feature.

Numerous processing techniques have been proposed to solve the challenges related to providing control over the shape (sidewall taper, for example) of the etched profile, while simultaneously providing a smooth surface on the etched sidewall. One technique for forming trenches having nearly vertical sidewalls employs a protective coating in the area of the opening to the trench. The material used to form the coating is resistant to the etchant being used to etch the trench. The coating may be applied continuously or may be applied at specific points in the trench formation process. For a more detailed description of this method, one skilled in the art should read U.S. Pat. No. 4,533,430 to Robert W. Bower, issued Aug. 6, 1985. In a related method, a silicon substrate is covered with a patterned mask which exposes select areas of a silicon substrate to plasma etching. Anisotropic etching is accomplished using alternating plasma etching and polymer formation steps. Additional information about this method may be found in Japanese Patent No. JP 63-13334, issued in 1988.

Some etching methods recommend the use of the same gas mixture during plasma etching of a feature and during formation of a protective film to protect etched surfaces. In one method, by changing the substrate bias, the process is said to be switched between a first state in which the primary reaction is substrate etching and a second state in which the primary reaction is deposition of a film on the substrate surface. For a detailed description of this technique, please refer to U.S. Pat. No. 4,795,529 to Kawasaki et al., issued Jan. 3, 1989.

Another description of the use of alternating plasma etching and polymer formation steps is found in U.S. Pat. No. 5, 501,893 to Laermer et al., issued Mar. 26, 1996. The etch and polymerization steps are carried out in an alternating, repetitive manner until etching is complete. Subsequently, in U.S. Pat. No. 6,284,148 B1, issued Sep. 4, 2001, Laermer et al. describe a method in which the quantity of polymer deposited decreases in the course of the polymer deposition steps.

In a related patent, a method is described for etching a trench in a semiconductor substrate using alternatively reactive ion etching and deposition of a passivation layer by chemical vapor deposition. The method includes varying one or more of a number of process variables with time during the etch process. The variation in process parameters is generally illustrated as being periodic, where the periodic variation corresponds to at least one sinusoidal, square, or sawtooth waveform. In one preferred embodiment, the process parameter varied over time is subjected to a ramped variation. Pumping out of the process chamber between either the steps within a given cycle or between cycles is also described. For more details of the process parameter variations described above, one skilled in the art may read U.S. Pat. No. 6,051,503 to Bhardwaj et al., issued Apr. 18, 2000.

The teachings of Bhardwaj et al. add another layer of complexity to the already complex processes described by Laermer et al. for the etching of deep trenches in silicon substrates. However, this increase in process complexity is said to address or reduce various problems in the etch process described in the Laermer et al. patents.

After reading the patents referred to above and a number of additional patents pertaining to the etching of deep trenches in silicon, it becomes readily apparent there is a need for a simplified, streamlined etch process which provides vertical recess feature sidewalls which are smooth (having a surface roughness of about 1 μm or less.) Further, there is a need for a process which reduces the amount of microloading which occurs when dense and isolated features are etched on the same substrate during the same etch process.

SUMMARY OF THE INVENTION

We have developed an uncomplicated method of plasma etching deeply recessed features such as deep trenches, of at least 5 μm in depth, in a silicon-containing substrate, in a manner which generates smooth sidewalls, having a roughness of about 500 nm or less, typically a roughness ranging from about 100 nm down to 20 nm, where the sidewall taper angle, relative to a horizontal plane parallel to the face of the substrate, typically ranges from about 85° to about 92°. In one embodiment of the method, an etchant species which stabilizes the overall etch process is used constantly during the plasma etch process, while other etchant species and polymer depositing species are applied intermittently, typically periodically, relative to each other. In another embodiment, the stabilizing etchant species is used constantly and a mixture of the other etchant species and polymer depositing species is used intermittently.

The stabilizing etchant species are generated from a stabilizing plasma source gas selected from the group consisting of HBr, HCl, $Cl_2$, and combinations thereof. Typically the stabilizing plasma source gas makes up from about 1 volumetric % to about 25 volumetric % of the total plasma source gas to the processing chamber. The intermittent plasma etchant species are generated from a gas selected from the group consisting of $SF_6$, $NF_3$, $CF_4$, $ClF_3$, $BrF_3$, $IF_3$, and combinations thereof, which are added to the stabilizing etchant species which are always present during the etching process. The intermittent plasma etchant species added to the stabilizing plasma species may also be HCl or $Cl_2$, in which case the HCl or $Cl_2$ or a combination thereof may be added to a different stabilizing etchant species, or may be increased in amount when some of the HCl or $Cl_2$ is already present as part of the stabilizing etchant species. The intermittent plasma etchant species may also be generated from a source gas selected from $C_2F_6$ or $C_3F_8$ when $O_2$ is added, where the concentration of $O_2$ relative to the $C_2F_6$ or $C_3F_8$ is typically about 20% or less by volume. Typically the intermittent plasma etchant species make up from about 25 volumetric % to about 50 volumetric % of the total plasma source gas feed. The polymer depositing plasma species are generated from a gas selected from the group consisting of fluorocarbons such as $C_2F_6$, $C_3F_6$, $C_4F_6$, $C_4F_8$, $C_4F_{10}$, or hydrofluorocarbons such as $C_2H_{2\ F4}$, $CHF_3$, $CH_2F_2$, $CH_3F$, $C_3HF_3$, $C_3H_2F_6$, $C_4H_5F$, or hydrocarbons such as $CH_4$, $C_2H_6$, or $C_3H_8$, where $CH_4$ is typically used. Combinations of any of these polymer depositing species may also be used. Typically the polymer depositing plasma species make up from about 25 volumetric % to about 50 volumetric % of the total plasma source gas feed.

Process variables such as, but not limited to, plasma source gas feed rate; length of time intermittent etchant species are in contact with the substrate; length of time polymer-depositing species are in contact with the substrate; process chamber pressure; substrate temperature; process chamber wall temperature; plasma power applied for plasma generation and maintenance; and, power applied to bias a substrate, may be increased (ramped up), decreased (ramped down), or remain constant as etching of a recession into a substrate continues. Depending on the particular application, it is helpful to maintain as many process variables as possible at a constant setting, as this provides the most uncomplicated embodiment of the invention.

When intermittent contact between the substrate and an etchant species or polymer deposition species is used, and the contact is periodic, the period itself may be frequency modulated.

Use of a stabilizing etchant continuously during the etch process enables a simplified, streamlined etch process; enables the formation of vertical sidewalls on recess etched features, while providing improved sidewall smoothness over previously known process methods; and, reduces the amount of microloading which occurs when dense and isolated features are etched on the same substrate during the same etch process.

DETAILED DESCRIPTION OF EXEMPLARY EMBODIMENTS

As a preface to the detailed description, it should be noted that, as used in this specification and the appended claims, the singular forms "a", "an", and "the" include plural referents, unless the context clearly dictates otherwise.

I. AN APPARATUS FOR PRACTICING THE INVENTION

The embodiment example etch processes described herein were carried out in a CENTURA® Integrated Processing System available from Applied Materials, Inc., of Santa Clara, Calif. This apparatus is described in detail below; however, it is contemplated that other apparatus known in the industry may be used to carry out the invention.

Figure 1A:
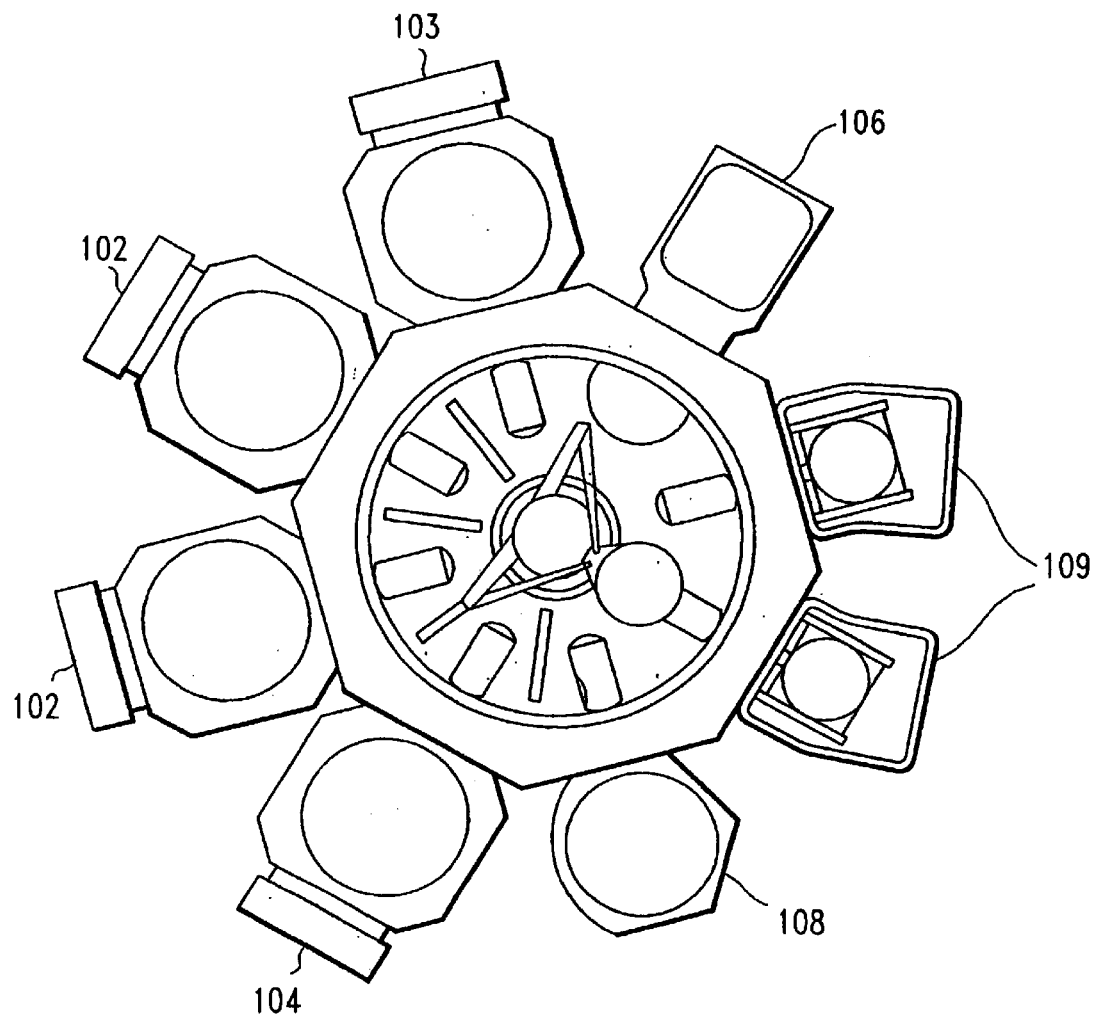
FIG. 1A illustrates a CENTURA® Integrated Processing System 100 of the kind which was used during the experimentation leading to the present invention.

FIG. 1A shows an elevation schematic of the CENTURA® Integrated Processing System 100. The CENTURA® Integrated Processing System 100 is a fully automated semiconductor fabrication system, employing a single-wafer, multi-chamber, modular design which accommodates a variety of wafer sizes. For example, as shown in FIG. 1A, the CENTURA® etch system may include decoupled plasma source (DPS) etch chambers 102; deposition chamber 103; advanced strip-and-passivation (ASP) chamber 104; wafer orienter chamber 106; cooldown chamber 108; and independently operated loadlock chambers 109.

Figure 1B:
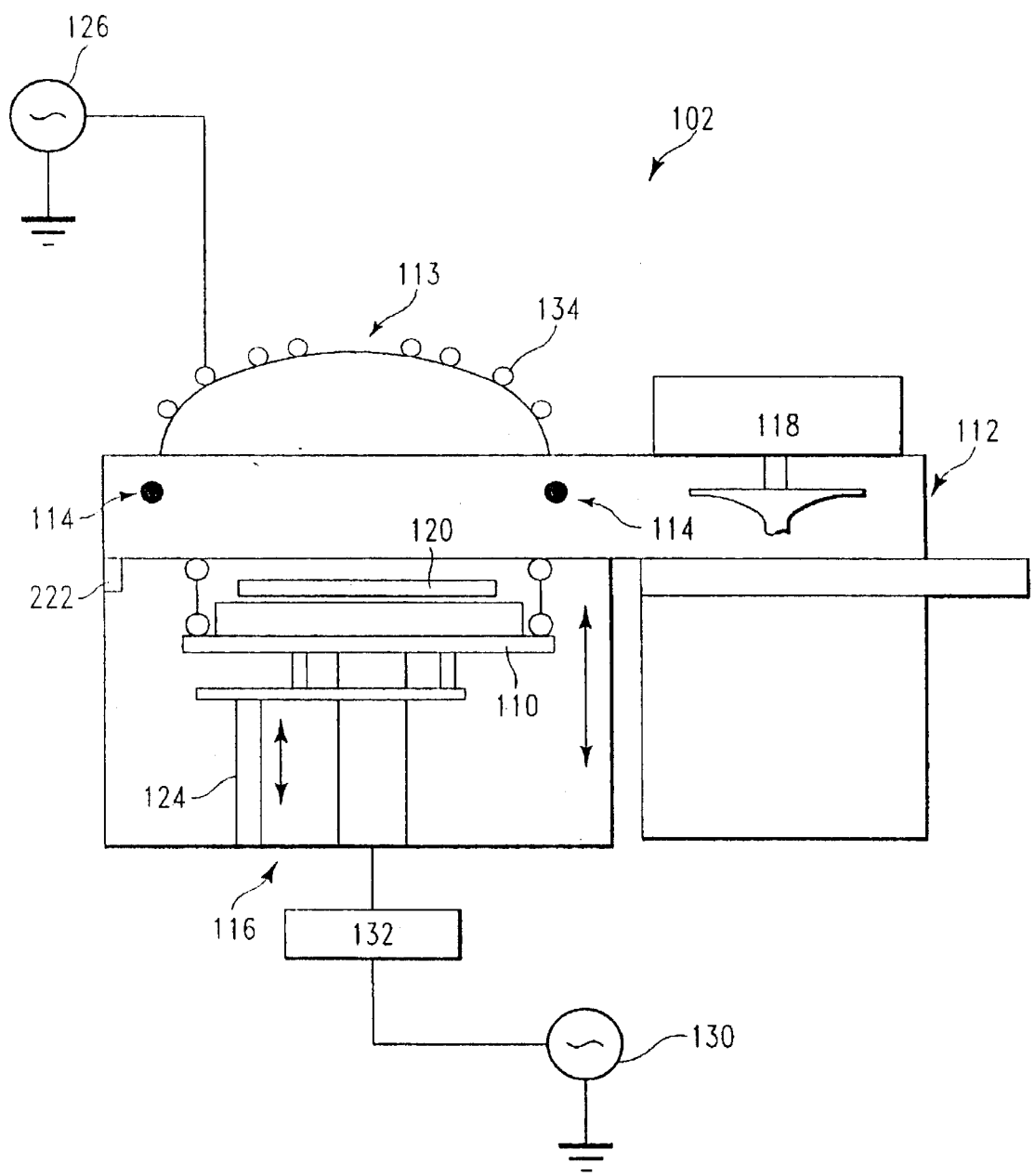
FIG. 1B shows a schematic of an individual CENTURA® DPS™ inductively coupled etch chamber 102 of the kind which was used during the experimentation leading to the present invention.

FIG. 1B is a schematic of an individual CENTURA® DPS™ etch chamber 102 of the type which may be used in the CENTURA® Integrated Processing System, commercially available from Applied Materials, Inc., Santa Clara, Calif. The equipment shown in schematic in FIG. 1B includes a Decoupled Plasma Source (DPS) of the kind described by Yan Ye et al. at the Proceedings of the Eleventh International Symposium of Plasma Processing, May 7, 1996, and as published in the Electrochemical Society Proceedings, Volume 96-12, pp. 222–233 (1996). The CENTURA® DPS™ etch chamber 102 is configured to be mounted on a standard CENTURA® mainframe.

The CENTURA® DPS™ etch chamber 102 consists of an upper chamber 112 having a ceramic dome 113, and a lower chamber 116. The lower chamber 116 includes an electrostatic chuck (ESC) cathode 110. Gas is introduced into the chamber via gas injection nozzles 114 for uniform gas distribution. Chamber pressure is controlled by a closed-loop pressure control system (not shown) with a throttle valve 118. During processing, a substrate 120 is introduced into the lower chamber 116 through inlet 122. The substrate 120 is held in place by means of a static charge generated on the surface of electrostatic chuck (ESC) cathode 110 by applying a DC voltage to a conductive layer located under a dielectric film on the chuck surface (not shown). The cathode 110 and substrate 120 are then raised by means of a wafer lift 124 and a seal is created against the upper chamber 112 in position for processing. Etch gases are introduced into the upper chamber 112 via the ceramic gas injection nozzles 114. The etch chamber 102 uses an inductively coupled plasma source power 126 operating at 2 MHZ, which is connected to inductive coil 134 for generating and sustaining a high density plasma. The wafer is biased with an RF source 130 and matching network 132 operating within the range of 100 kHz to 13.56 MHZ; more typically, within the range of 100 kHz to 2 MHZ. Power to the plasma source 126 and substrate biasing means 130 are controlled by separate controllers (not shown).

The temperature on the surface of the etch chamber walls is controlled using liquid-containing conduits (not shown) which are located in the walls of the etch chamber 102. The temperature of the semiconductor substrate is controlled using the temperature of the electrostatic chuck cathode 110 upon which the substrate 120 rests. Typically, a helium gas flow is used to facilitate heat transfer between the substrate and the pedestal.

As previously mentioned, although the etch process chamber used to process the substrates described in the Examples presented herein was an inductively coupled etch chamber of the kind shown in schematic in FIG. 1B, any of the etch processors available in the industry should be able to take advantage of the etch chemistry described herein, with some adjustment to other process parameters.

II. EXEMPLARY METHOD OF THE INVENTION ETCHING A DEEP TRENCH HAVING A SOOTH SIDEWALL IN A SILICON SUBSTRATE

EXAMPLE ONE Comparative Example

For purposes of comparison, a first etch process was carried out in a manner previously demonstrated in the art, where a trench is anisotropically etched in a silicon substrate. A g-line or i-line photoresist was applied over the substrate and then patterned to produce a mask over the silicon surface. The masked silicon surface was then exposed to a reactive etching plasma generated from an $SF_6$ plasma source gas, as step one of the etching process. Subsequently, in a second step, the etched silicon surface was contacted with a plasma generated from a polymer-forming gas ($C_4F_8$), to cover the etched silicon surfaces with a polymer layer. Steps one and two were repeated a number of times to provide deep etching into the silicon substrate. The data for this comparative example is presented in Table One as Run #1. The appearance of the etched sidewalls of the trench is shown in FIG. 2A, and the degree of microloading which occurred is shown in FIG. 3A.

Figure 2A:
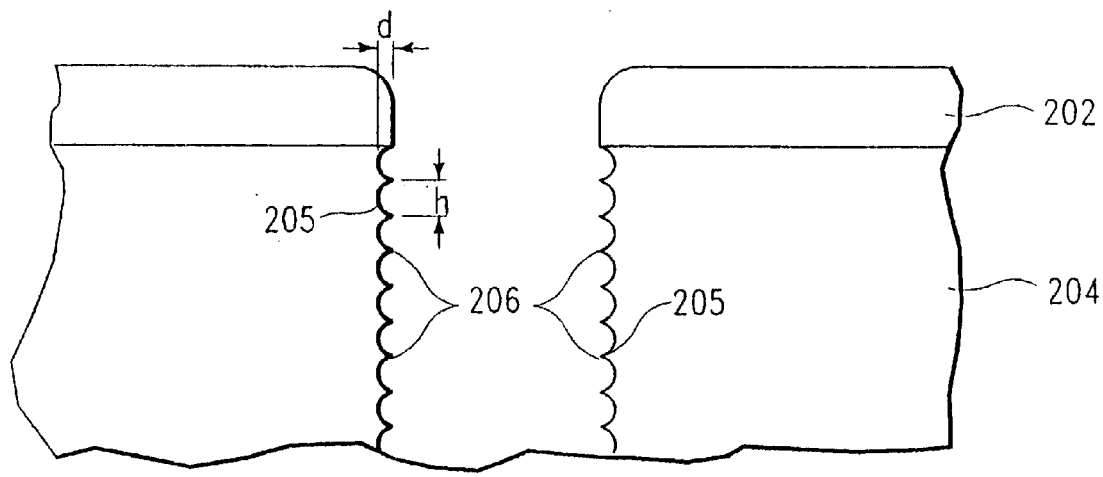
FIG. 2A shows the roughness of a sidewall surface on a deep trench produced using a prior art comparative method which includes alternating etch and polymer deposition steps.

With respect to FIG. 2A, the trench structure includes an i-line photoresist masking layer 202 and an underlying silicon substrate 204. The sidewalls 205 of trench structure 200 exhibited significant "scalloping", where the cycling between etch and polymer deposition steps one and two, respectively, causes a rough sidewall 205. In particular, the depth "d" of scallops 206 was in the range of about 35 nm to 40 nm, while the height "h" of scallops 206 was in the range of about 180 nm to 190 nm.

Figure 3A:
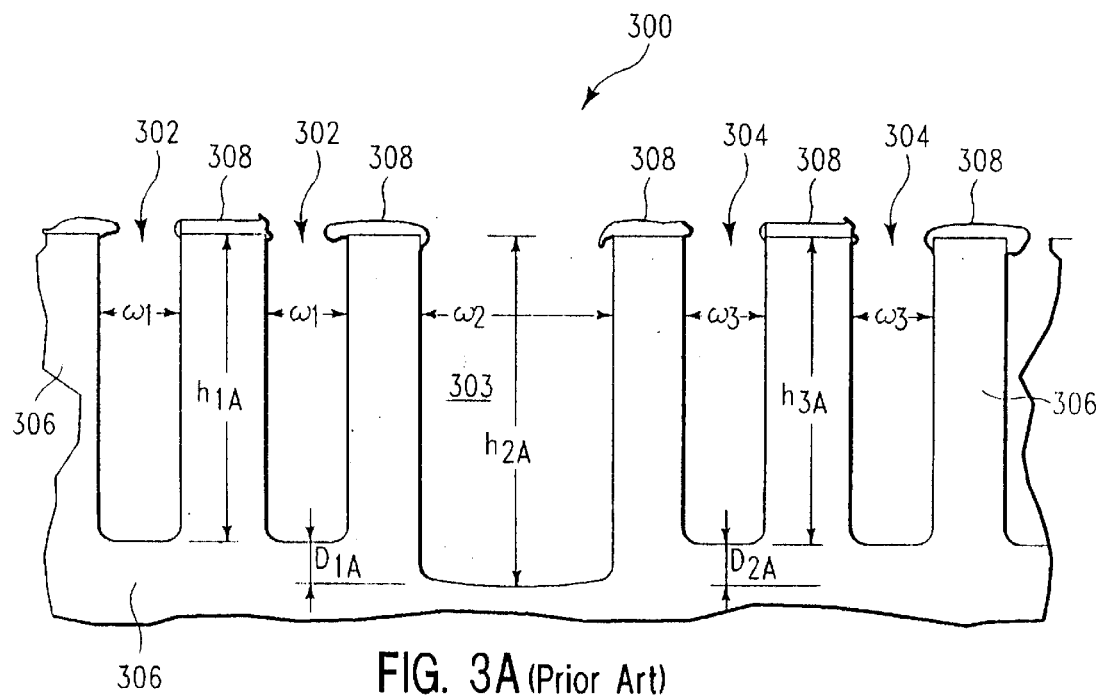
FIG. 3A shows the microloading effect for a series of trenches produced using a prior art comparative method which includes alternating etch and polymer deposition steps.

With respect to FIG. 3A, the trench structure 300 includes a series of trenches of different sizes, etched into silicon substrate 306 through i-line patterned photoresist mask 308. Trenches 302 are approximately 4,400 nm in width "$W_1$", and 17,300 nm in height "$h_{1A}$". Trench 303 is approximately 10,600 nm in width "$W_2$", and 20,200 nm in height "$h_{2A}$". Trenches 304 are approximately 3,200 nm in width "$W_3$", and 16,600 nm in height "$h_{3A}$". The difference in etch depth observed between the 4,400 nm wide trenches 302 and the 10,600 nm wide trench 303 was about 2,900 nm, while the difference in etch depth observed between the 3,200 nm wide trenches 304 and 10,600 nm wide trench 303 was about 3,600 nm. This difference in etch depth, which is a function of the size (width) being etched, is an illustration of a microloading effect.

EXAMPLE TWO

Figure 2B:
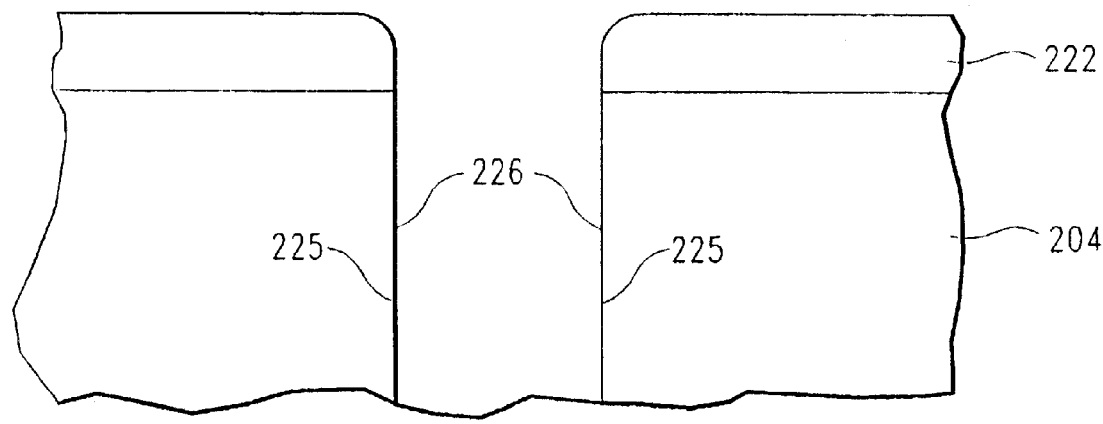
FIG. 2B shows the roughness of a sidewall surface on a trench produced using the method of the invention, where a stabilizing etchant species is maintained continuously throughout the etch process, in combination with an intermittent etchant species and an intermittent polymer-depositing plasma species which were applied alternately in a series of etch/polymer deposition cycles throughout the etch process.
Figure 3B:
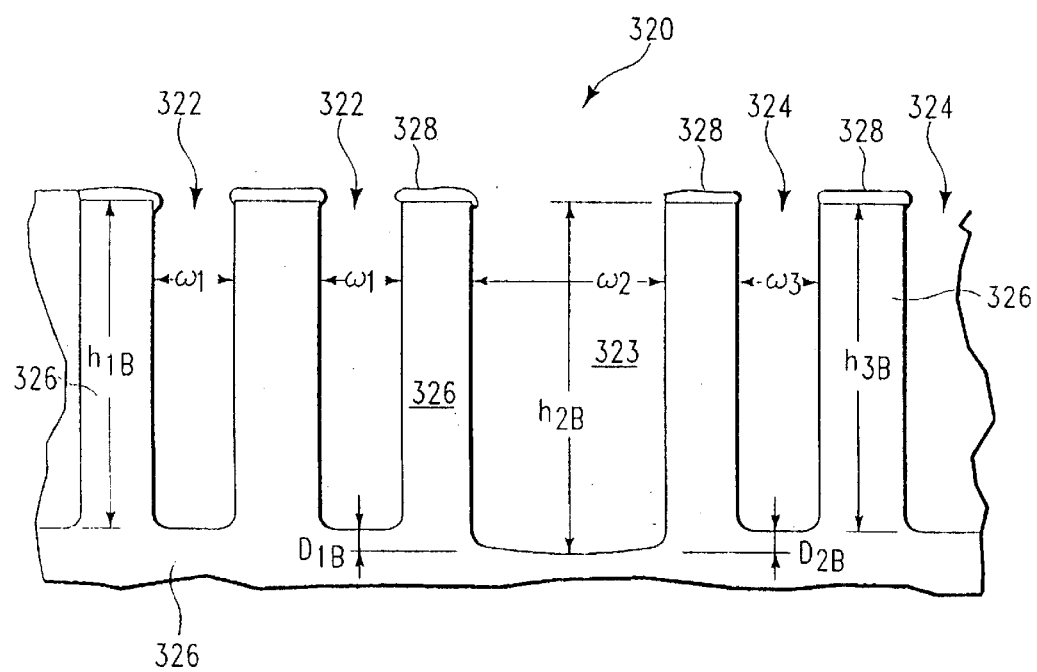
FIG. 3B shows the microloading effect for a series of trenches produced using the method of the invention, where a stabilizing etchant species which is maintained continuously throughout the etch process, in combination with an intermittent etchant species and an intermittent polymer-depositing plasma species which were applied alternately in a series of etch/polymer deposition cycles throughout the etch process.

Data for one embodiment of the present invention, which makes use of a stabilizing etchant which is constantly present during the etch process, is presented in Table One as Run #4, the appearance of the etched sidewalls of the trench is shown in FIG. 2B, and the degree of microloading which occurred is shown in FIG. 3B. A patterned i-line photoresist mask was formed over a silicon substrate. In a first etch step, the exposed portion of the silicon substrate was contacted with a plasma generated from a stabilizing etchant gas in combination with a reactive etching gas. Subsequently, in a second step, the etched silicon surface was contacted with a plasma generated from the same stabilizing etchant gas, in combination with a polymer-forming gas. Steps one and two were repeated a number of times to provide deep etching into the silicon substrate.

With respect to FIG. 2B, the trench structure 220 includes a patterned i-line photoresist masking layer 222 and an underlying silicon substrate 224. The sidewalls 225 of trench structure 220 exhibited insignificant "scalloping", providing a particularly smooth trench sidewall 225. In particular, the depth of disturbances on the surface 226 of sidewall 225 was less than 13 nm. The spacing between disturbances was in the range of about 180 nm to 190 nm, indicating that these small disturbances were due to cycling during the etch process. However, the roughness of the sidewall surface of the trench had been reduced by about 65% due to the presence of the plasma species generated from the stabilizing etchant gas which was present during the entire etch process.

With respect to FIG. 3B, the trench structure 320 included a series of trenches of different sizes, etched into silicon substrate 326 through patterned mask 328. Trenches 322 are approximately 4,400 nm in width "$W_1$", and 18,800 nm in height "$h_{1B}$". Trench 323 is approximately 10,600 nm in width "$W_2$", and 20,200 nm in height "$h_{2B}$". Trenches 324 are approximately 3,200 nm in width "$W_3$", and 18,800 nm in height "$h_{3B}$". The difference in etch depth observed between the 4,400 nm wide trenches 322 and the 10,600 nm wide trench 323 was about 1,400 nm. This compares with the difference in etch depth observed between the 4,400 nm wide trenches 302 and the 10,600 nm wide trench 303 shown in FIG. 3A representing the comparative example. This shows a reduction in etch depth difference of about 40% was obtained using the present method rather than the prior art comparative method of Example One. This percentage difference is illustrated by $(D_{1A}-D_{1B})/D_{1A} \times 100$, with reference to FIGS. 3A and 3B. In the present Example Two, the difference in etch depth observed between 3,200 run wide trenches 324 and the 10,600 nm wide trench 323 was about 2,150 nm. A comparison with the prior art Example One data shows that a reduction (improvement) in etch depth difference of about 36% was obtained when the present invention etch method was used. This percentage etch depth difference is illustrated by $(D_{2A}-D_{2B})/D_{2A} \times 100$. This decrease in the difference of etch depth as a function of the size of the trench is an indication of an improvement in microloading effect and is attributed to the use of a stabilizing etchant continuously throughout the etch process.

Table One presents a series trial etching processes, represented as Runs #1 through #4, where Run #1 is the comparative example.

TABLE ONE

Process Conditions for Various Trench Etching Experiments

| | Plasma Source Gas | Flow Rate (sccm) | Time (sec) | Substrate Bias Power & Frequency (W) & (kHz) | Substrate Voltage (-V) | Plasma Source Power & Frequency (W) & (kHz) | Pressure (mTorr) | No. of Times Step was repeated |
|---|---|---|---|---|---|---|---|---|
| Run 1 | | | | | | | | |
| Step #1 | $SF_6$ | 200 | 5 | 0 W | 5–10 (self bias) | 1,000 & 1256 | 70 | 100 |
| Step #2 | $C_4F_8$ | 200 | 6 | 7 & 400 | 40 | 1,000 & 1256 | 70 | 100 |
| Run 2 | | | | | | | | |
| Step #1 | HBr $C_4F_8$ | 6 200 | 5 | 0 W | 5–10 (self bias) | 1,000 & 1256 | 70 | 100 |
| Step #2 | HBr $SF_6$ | 6 200 | 6 | 7 & 400 | 40 | 1,000 & 1256 | 70 | 100 |
| Run 3 | | | | | | | | |
| Step #1 | HBr $C_4F_8$ | 12 200 | 5 | 0 W | 5–10 (self bias) | 1,000 & 1256 | 70 | 100 |
| Step #2 | HBr $SF_6$ | 12 200 | 6 | 7 & 400 | 40 | 1,000 & 1256 | 70 | 100 |
| Run 4 | | | | | | | | |
| Step #1 | HBr $C_4F_8$ | 20 200 | 5 | 0 W | 5–10 (self bias) | 1,000 & 1256 | 70 | 100 |
| Step #2 | HBr $SF_6$ | 20 200 | 6 | 7 & 400 | 40 | 1,000 & 1256 | 70 | 100 |

The substrate temperature during each of the steps described above was initially about 15° C. to 17° C. The temperature rose over a two minute period, due to processing conditions, to a temperature between about 25° C. and 28° C. and remained there for the remainder of the process.

The substrate temperature during each of the steps described above was initially about 15° C. to 17° C. The temperature rose over a two minute period, due to processing conditions, to a temperature between about 25° C. and 28° C. and remained there for the remainder of the process.

TABLE TWO

Structure After Etch Processing As Described in Table One

| Run # | Etch Depth @ 4.4 µm Space Between Trenches (nm) | Etch Depth @ 10.6 µm Space Between Trenches (nm) | Patterned Resist Thickness Remaining After Etch (µm) | Scallop Size (Å) | Etch Selectivity Si Substrate: standard i-line photoresist | Microloading |
|---|---|---|---|---|---|---|
| 1 | 1,725 | 2,000 | 0.53 | 333 | 137 | 15% |
| 2 | NA | 2,100 | 0.56 | 333 | 146 | NA |
| 3 | NA | 2,000 | 0.62 | 333 | 147 | NA |
| 4 | 1,880 | 2,100 | 0.63 | 150 | 154 | 10% |

NA = Not measured, and Not Available.

TABLE THREE

Process Conditions for Silicon Etching Step

| Process Parameter | Range of Process Conditions | Typical Process Conditions | Optimum Known Process Conditions |
|---|---|---|---|
| Stabilizing Etchant[1] Flow Rate (sccm)[2] | 1–200 | 2–100 | 20 |
| $SF_6$ Flow Rate (sccm)[2] | 20–500 | 50–350 | 200 |
| Inert gas[3] Flow Rate (sccm)[2] | 0–100 | 20–70 | unknown |
| Plasma Source Power (W) | 700–2000 | 900–1300 | 1000 |
| Plasma Source Power RF Frequency (kHz) | 100–13,560 | 160–2000 | 200–400 |
| Substrate Bias Power (W) | 0–40 | 5–15 | 5–10 |
| Substrate Bias Power RF Frequency (kHz) | 100–500 | 200–500 | 400 |
| Substrate Bias Voltage (−V) | 2–100 | 10–100 | 10–50 |
| Process Chamber Pressure (mTorr) | 4–200 | 25–180 | 30–150 |
| Substrate Temperature (° C.) | 10–120 | 20–50 | 20–30 |
| Etch Time Period (seconds) | 3–30 | 3–20 | 4–18 |

[1]The stabilizing etchant plasma source gas may be selected from HBr, HCl, $Cl_2$ and combinations thereof. This is by way of example, and not by way of limitation.
[2]The above data is for a 200 mm wafer size CENTURA ® DPS ™ etch chamber. One skilled in the art will be able to calculate the flow rates and other process variables for etch chambers of different sizes in a manner which will provide equivalent residence time for etchant species during the plasma etching.
[3]The inert gas may be a noble gas, including He, Ne, Ar, Kr, or Xe, by way of example and by way of limitation; or may be another gas which is chemically inert under the process conditions described above.

[1]The stabilizing etchant plasma source gas may be selected from HBr, HCl, $Cl_2$ When a different intermittent fluorine-containing etchant gas such as $NH_3$ or $CF_4$ is substituted for $SF_6$, it is necessary to adjust the flow rate of the etchant gas to maintain approximately the same concentration of fluorine etchant species. One skilled in the art can make this adjustment with minor experimentation in view of published kinetics data for the fluorine-containing gases mentioned.

TABLE FOUR

Process Conditions for Polymer Deposition Step

| Process Parameter | Range of Process Conditions | Typical Process Conditions | Optimum Known Process Conditions |
|---|---|---|---|
| Stabilizing Etchant[1] (sccm)[2] | 1–200 | 2–100 | 20 |
| Fluorocarbon[3] (sccm)[2] | 50–200 | 25–220 | 100–220 |
| or Hydrofluorocarbon[4] (sccm)[2] | 50–200 | 25–220 | 180–220 |
| or Hydrocarbon[5] (sccm)[2] | 50–100 | 20–50 | unknown |
| Inert Gas[7] Flow Rate (sccm)[2] | 0–100 | 0–100 | 0–100 |
| Plasma Source Power (W) | 700–3000 | 900–2000 | 1000 |
| Plasma Source Power RF Frequency (kHz) | 100–13,560 | 100–2000 | 200–400 |
| Substrate Bias Power (W) | 0 | 0 | 0 |
| Substrate Bias Power RF Frequency (kHz) | 160–560 | 200–500 | 400 |
| Substrate Bias Voltage (−V) | 5 (self bias) | 5 (self bias) | 5 (self bias) |
| Process Chamber Pressure (mTorr) | 5–200 | 25–180 | 30–150 |
| Substrate Temperature (° C.) | 15–120 | 20–50 | 20–30 |
| Polymer Deposition Time Period (seconds) | 3–20 | 3–20 | 4–7 |

[1]The stabilizing etchant plasma source gas may be selected from HBr, HCl, $CL_2$, and combinations thereof, by way of example, and not by way of limitation.
[2]The above data is for a 200 mm wafer size CENTURA ® DPS ™ etch chamber. One skilled in the art will be able to calculate the flow rates and other process conditions for etch chambers of different sizes in a manner which will provide equivalent residence time for etchant species during the plasma etching.
[3]Fluorocarbons which may be used include $C_2F_6$, $C_3F_6$, $C_4F_6$, $C_4F_8$, $C_4F_{10}$, and combinations thereof.
[4]Hydrofluorocarbons which may be used include $CHF_3$, $CH_2F_2$, $C_2H_2F_4$, $CH_3F$, $C_3HF_3$, $C_3H_2F_6$, $C_4H_5F$, and combinations thereof.
[5]Hydrocarbon which may be used include $CH_4$, $C_2H_6$, $C_3H_8$, and combinations thereof, for example.
[7]The inert gas may be a noble gas, including He, Ne, Ar, Kr, or Xe, by way of example and by way of limitation; or may be another gas which is chemically inert under the process conditions described above.

[1]The stabilizing etchant plasma source gas may be selected from HBr, HCl, $Cl_2$, and combinations thereof, by way of example, and not by way of limitation.
[2]The above data is for a 200 mm wafer size CENTURA® DPS™ etch chamber. One skilled in the art will be able to calculate the flow rates and other process conditions for etch chambers of different sizes in a manner which will provide equivalent residence time for etchant species during the plasma etching.
[3]Fluorocarbons which may be used include $C_2F_6$, $C_3F_6$, $C_4F_6$, $C_4F_8$, $C_4F_{10}$, and combinations thereof.
[4]Hydrofluorocarbons which may be used include $CHF_3$, $CH_2F_2$, $C_2H_2F_4$, $CH_3F$, $C_3HF_3$, $C_3H_2F_6$, $C_4H_5F$, and combinations thereof.
[5]Hydrocarbon which may be used include $CH_4$, $C_2H_6$, $C_3H_8$, and combinations thereof, for example.

As previously mentioned, the stabilizing etchant species which is used constantly during the plasma etching process may be used in combination with an intermittent etch step etchant species during the etch step, followed by intermittent application of a polymer deposition step plasma species, or may be used in combination with an intermittent plasma comprised of admixed etchant species and polymer deposition species. The number of applications of intermittent etch step etchant species and intermittent polymer deposition species will vary depending on the depth of the recessed feature to be etched. Typically, for example, for a trench which is about 20 µm deep, intermittent etching will be carried out from about 50 to about 100 times. When the polymer deposition is carried out separately from the intermittent etching, the polymer deposition step for the 20 µm deep trench will be carried out from about 50 to about 100 times.

After completion of the etching of the recessed feature, it may be desirable to use a clean up step to remove residual masking materials and/or residual polymeric material from the etching process. One example of a clean up method is an oxygen plasma clean-up step which is particularly useful when a hard mask layer (such as silicon oxide, silicon nitride, or silicon oxynitride) is used in lieu of, or in combination with, a photoresist, due to the tendency of oxygen to rapidly etch conventional organic photoresists.

TABLE FIVE

Process Conditions for Clean-up Step

| Process Parameter | Range of Process Conditions | Typical Process Conditions | Optimum Known Process Conditions |
|---|---|---|---|
| $O_2$ Flow Rate (sccm) | 50–500 | 100–300 | 200 |
| Plasma Source Power (W) | 500–3000 | 700–2000 | 1000 |
| Plasma Source Power RF Frequency (kHz) | 100–3,560 | 100–2000 | 200–400 |
| Substrate Bias Power (W) | 0–100 | 0–50 | 5–10 |
| Substrate Bias Power RF Frequency (kHz) | 100–500 | 200–500 | 400 |
| Substrate Bias Voltage (−V) | 0–200 | 20–150 | 40–100 |
| Process Chamber Pressure (mTorr) | 20–200 | 25–100 | 30 |
| Substrate Temperature (° C.)* | 40–120 | 50–100 | 60 |
| Clean-Up Step Time Period (seconds) | 10–600 | 100–400 | 180 |

*The substrate temperature provided is for an etch chamber having a decoupled plasma source. If a different type of etch chamber is used, the substrate temperature may be within the range of about 200° C. up to 250° C. during the oxygen plasma clean-up.

The above described exemplary embodiments are not intended to limit the scope of the present invention, as one skilled in the art can, in view of the present disclosure expand such embodiments to correspond with the subject matter of the invention claimed below.

We claim:

1. A method of plasma etching a pattern containing at least one deeply recessed feature which is etched to a depth of 5 μm or more into a silicon-containing substrate, in a manner which generates smooth sidewalls on said at least one feature which is deeply recessed, comprising:
   applying at least one stabilizing etchant species continuously throughout etching of said deeply recessed feature;
   intermittently applying at least one second etchant species, different from said stabilizing etchant species, during etching of said deeply recessed feature; and
   intermittently applying at least one polymer depositing species during etching of said deeply recessed feature.

2. A method in accordance with claim 1, wherein said second etchant species is applied separately from said polymer depositing species.

3. A method in accordance with claim 1, wherein said second etchant species and said polymer depositing species are applied simultaneously.

4. A method in accordance with claim 1, wherein said second etchant species is applied both in the absence of polymer depositing species in some instances, and in combination with polymer depositing species in other instances, during etching of said deeply recessed feature.

5. A method in accordance with claim 1, or claim 2, or claim 3, or claim 4, wherein said stabilizing etchant species is generated from a plasma source gas selected from the group consisting of HBr, HCl, $Cl_2$, and combinations thereof.

6. A method in accordance with claim 5, wherein said stabilizing species is generated from a plasma source gas comprising HBr.

7. A method in accordance with claim 5, wherein said at least one second etchant species is generated from a plasma source gas selected from the group consisting of $SF_6$, $NF_3$, $CF_4$, $ClF_3$, $BrF_3$, $IF_3$, and combinations thereof.

8. A method in accordance with claim 5, wherein said at least one second etchant species is generated from a plasma source gas comprising HCl or $Cl_2$, wherein said stabilizing species is generated from a different source gas.

9. A method in accordance with claim 5, wherein said at least one second etchant species is generated from a source gas selected from the group consisting of $C_2F_6$, $C_3F_8$, or combinations thereof used in combination with $O_2$.

10. A method in accordance with claim 6, wherein said at least one second etchant species is generated from a plasma source gas selected from the group consisting of $SF_6$, $NF_3$, $CF_4$, $ClF_3$, $BrF_3$, $IF_3$, and combinations thereof.

11. A method in accordance with claim 6, wherein said at least one second etchant species is generated from a plasma source gas comprising HCl or $Cl_2$, wherein said stabilizing species is generated from a different source gas.

12. A method in accordance with claim 6, wherein said at least one second etchant species is generated from a plasma source gas selected from the group consisting of $C_2F_6$, $C_3F_8$, or combinations thereof used in combination with $O_2$.

13. A method in accordance with claim 5, wherein said at least one polymer depositing species is generated from a plasma source gas containing a fluorocarbon.

14. A method in accordance with claim 13, wherein said fluorocarbon is selected from the group consisting of $C_2F_6$, $C_3F_6$, $C_4F_6$, $C_4F_8$, $C_4F_{10}$, and combinations thereof.

15. A method in accordance with claim 6, wherein said at least one polymer depositing species is generated form a plasma source gas containing a fluorocarbon.

16. A method in accordance with claim 15, wherein said fluorocarbon is selected from the group consisting of $C_2F_6$, $C_3F_6$, $C_4F_6$, $C_4F_8$, $C_4F_{10}$, and combinations thereof.

17. A method in accordance with claim 5, wherein said at least one polymer depositing species is generated from a plasma source gas containing a hydrofluorocarbon.

18. A method in accordance with claim 17, wherein said hydrofluorocarbon is selected from the group consisting of $C_2H_2F_4$, $CHF_3$, $CH_2F_2$, $CH_3F$, $C_3HF_3$, $C_3H_2F_6$, $C_4H_5F$, and combinations thereof.

19. A method in accordance with claim 5, wherein said at least one polymer depositing species is generated from a plasma source gas containing a hydrocarbon.

20. A method in accordance with claim 17, wherein said hydrocarbon is $CH_4$, $C_2H_6$, $C_3H_8$, or combinations thereof.

21. A method in accordance with claim 6, wherein said at least one polymer depositing species is generated from a plasma source gas containing a hydrofluorocarbon.

22. A method in accordance with claim 21, wherein said hydrofluorocarbon is selected from the group consisting of $C_2H_2F_4$, $CHF_3$, $CH_2F_2$, $CH_3F$, $C_3HF_3$, $C_3H_2F_6$, $C_4H_5F$, and combinations thereof.

23. A method in accordance with claim 6, wherein said at least one polymer depositing species is generated from a plasma source gas containing a hydrocarbon.

24. A method in accordance with claim 23, wherein said hydrocarbon is $CH_4$, $C_2H_6$, $C_3H_8$, or combinations thereof.

25. A method in accordance with claim 5, wherein said at least one polymer depositing species is generated from a plasma source gas containing a mixture of at least one fluorocarbon with at least one hydrofluorocarbon.

26. A method in accordance with claim 25, wherein said at least one fluorocarbon is selected from the group consisting of $C_2F_6$, $C_3F_6$, $C_4F_6$, $C_4F_8$, $C_4F_{10}$, and said at least one hydrofluorcarbon is selected from the group consisting of $C_2H_2F_4$, $CHF_3$, $CH_2F_2$, $CH_3F$, $C_3HF_3$, $C_3H_2F_6$, $C_4H_5F$.

27. A method in accordance with claim 6, wherein said at least one polymer depositing species is generated from a plasma source gas containing a mixture of at least one fluorocarbon with at least one hydrofluorocarbon.

28. A method in accordance with claim 27, wherein said at least one fluorocarbon is selected from the group consisting of $C_2F_6$, $C_3F_6$, $C_4F_6$, $C_4F_8$, $C_4F_{10}$, and said at least one hydrofluorocarbon is selected from the group consisting of $C_2H_2F_4$, $CHF_3$, $CH_2F_2$, $CH_3F$, $C_3HF_3$, $C_3H_2F_6$, $C_4H_5F$.

29. A method in accordance with claim 1, wherein said intermittent application is a periodic application.

30. A method in accordance with claim 1, said second etchant species is applied in an alternating sequence with said polymer depositing species.

31. A method in accordance with claim 30, wherein said intermittent application is a periodic application.

32. A method in accordance with claim 1, wherein said smooth sidewall shows a surface roughness of about 500 nm or less.

33. A method in accordance with claim 32, wherein said surface roughness ranges from about 100 nm to about 20 nm.

34. A method in accordance with claim 1 or claim 32, wherein said smooth sidewall forms an angle ranging between about 85° and about 92° with a horizontal underlying substrate.

35. A method of plasma etching a pattern containing at least one deeply recessed feature which is etched to a depth of 5 μm or more into a silicon-containing substrate, in a manner which generates smooth sidewalls on said at least one feature which is deeply recessed, comprising:

forming a plasma from a source gas comprising at least one stabilizing etchant gas, which stabilizing etchant gas is used throughout the etching of said deeply recessed feature;

intermittently adding to said source gas at least one second etchant gas during etching of said deeply recessed feature; and intermittently adding to said source gas at least one polymer depositing gas during etching of said deeply recessed feature.

36. A method in accordance with claim 35, wherein said second etchant gas is added at a time when said polymer depositing gas is not added.

37. A method in accordance with claim 35, wherein said second etchant gas is added at a time when said polymer depositing gas is also added.

38. A method in accordance with claim 35, wherein said second etchant gas is added both in the absence of polymer depositing gas in some instances, and in combination with polymer depositing gas in other instances, during etching of said deeply recessed feature.

39. A method in accordance with claim 35, or claim 36, or claim 37, or claim 38, wherein said stabilizing etchant gas is selected from the group consisting of HBr, HCl, $Cl_2$, and combinations thereof.

40. A method in accordance with claim 39, wherein said stabilizing etchant gas is HBr.

41. A method in accordance with claim 39, wherein said at least one second etchant gas is selected from the group consisting of $SF_6$, $NF_3$, $CF_4$, $ClF_3$, $BrF_3$, $IF_3$, and combinations thereof.

42. A method in accordance with claim 39, wherein said at least one second etchant gas is HCl or $Cl_2$, wherein said stabilizing species is a different species.

43. A method in accordance with claim 39, wherein said stabilizing etchant gas includes HCl or $Cl_2$, and wherein said at least one second etchant gas includes HCl or $Cl_2$, whereby said source gas includes an increased amount of HCl or $Cl_2$ when said second etchant gas is added to said source gas.

44. A method in accordance with claim 39, wherein said at least one second etchant gas is selected from the group consisting of $C_2F_6$, $C_3F_8$, or combinations thereof, used in combination with $O_2$.

45. A method in accordance with claim 40, wherein said at least one etchant gas is selected from the group consisting of $SF_6$, $NF_3$, $CF_4$, $ClF_3$, $BrF_3$, $IF_3$, and combinations thereof.

46. A method in accordance with claim 40, wherein said at least one second etchant gas is selected from the group consisting of HCl, $Cl_2$, and combinations thereof.

47. A method in accordance with claim 40, wherein said at least one second etchant gas is selected from the group consisting of $C_2F_6$, $C_3F_8$, or combinations thereof, used in combination with $O_2$.

48. A method in accordance with claim 40, wherein said at least one polymer depositing gas is a fluorocarbon.

49. A method in accordance with claim 40, wherein said at least one polymer depositing gas is a hydrofluorocarbon.

50. A method in accordance with claim 40, wherein said at least one polymer depositing gas is a hydrocarbon.

51. A method in accordance with claim 40, wherein said at least one polymer depositing gas contains a mixture of at least one fluorocarbon with at least one hydrofluorocarbon.

* * * * *